US007531946B2

(12) United States Patent
Yamauchi et al.

(10) Patent No.: US 7,531,946 B2
(45) Date of Patent: May 12, 2009

(54) PIEZOELECTRIC SOUNDING BODY

(75) Inventors: Masakazu Yamauchi, Imizu (JP); Shigemasa Kusabiraki, Takaoka (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 11/760,873

(22) Filed: Jun. 11, 2007

(65) Prior Publication Data

US 2007/0228893 A1 Oct. 4, 2007

Related U.S. Application Data

(63) Continuation of application No. PCT/JP2006/322621, filed on Nov. 14, 2006.

(30) Foreign Application Priority Data

Feb. 21, 2006 (JP) ............................ 2006-043402

(51) Int. Cl.
*H01L 41/053* (2006.01)

(52) U.S. Cl. ...................................... 310/348; 310/324

(58) Field of Classification Search .................. 310/324
See application file for complete search history.

(56) References Cited

U.S. PATENT DOCUMENTS 4,354,131 A * 10/1982 Kaji ........................... 310/328
5,889,351 A * 3/1999 Okumura et al. ............ 310/321
6,420,818 B1 7/2002 Kishimoto et al.
6,472,797 B1 * 10/2002 Kishimoto .................. 310/324
6,912,288 B2 * 6/2005 Nakashima et al. ......... 381/190
2001/0004180 A1 * 6/2001 Kishimoto .................. 310/324
2003/0202672 A1 * 10/2003 Yamauchi et al. ........... 381/190

FOREIGN PATENT DOCUMENTS

JP 63-68298 5/1988
JP 2-161899 6/1990
JP 2002-112391 4/2002
JP 2003-219499 7/2003
JP 2004-96225 3/2004
JP 2004-221903 8/2004
JP 2004-266643 9/2004
WO WO 2006/025138 3/2006

OTHER PUBLICATIONS

PCT/JP2006/312300, Written Opinion dated Aug. 22, 2006.

* cited by examiner

*Primary Examiner*—Quyen P Leung
*Assistant Examiner*—Bryan P Gordon
(74) *Attorney, Agent, or Firm*—Dickstein Shapiro LLP

(57) ABSTRACT

A piezoelectric sounding body in which a stable high sound pressure can be obtained over a wide frequency band. The piezoelectric sounding body includes a resin film, a piezoelectric vibrating plate attached to the center of one surface of the resin film with a tackiness layer, and a case supporting the periphery of the resin film. The piezoelectric vibrating plate is formed in a rectangular shape. An adhesive is applied between the middle of each long side of the piezoelectric vibrating plate and the resin film, along each long side of the piezoelectric vibrating plate. The separation between the piezoelectric vibrating plate and the tackiness layer can be prevented during sounding, and a stable sound pressure can be obtained for a prolonged period.

15 Claims, 8 Drawing Sheets

PIEZOELECTRIC SOUNDING BODY

CROSS REFERENCE TO RELATED APPLICATIONS

The present application is a continuation of International Application No. PCT/JP2006/322621, filed Nov. 14, 2006, which claims priority to Japanese Patent Application No. JP2006-043402, filed Feb. 21, 2006, the entire contents of each of these applications being incorporated herein by reference in their entirety.

FIELD OF THE INVENTION

The present invention relates to piezoelectric sounding bodies, for example, piezoelectric speakers and piezoelectric sounders.

BACKGROUND OF THE INVENTION

Piezoelectric sounding bodies are widely used as a piezoelectric sounder or a piezoelectric speaker in electronic devices, home electric appliances, cell-phones, and the like. Conventional piezoelectric sounding bodies have a piezoelectric vibrating plate contained in a case. The periphery of the piezoelectric vibrating plate is fixed to the case. Therefore, conventional piezoelectric sounding bodies have the problem of high resonance frequency. In order to lower the resonance frequency, the size of the piezoelectric vibrating plate has to be increased. Accordingly, the size of the case also has to be increased. In addition, the sound pressure drops sharply between the primary resonance frequency and the secondary resonance frequency, and a substantially flat sound pressure characteristic cannot be obtained over a wide band.

Patent Document 1 discloses a piezoelectric sounding body having a structure in which a disk-shaped bimorph piezoelectric vibrating plate is attached to a resin film larger than the piezoelectric vibrating plate, and the periphery of the resin film is supported by a case. In this structure, the piezoelectric vibrating plate is supported by the case via the resin film. Therefore, the size reduction and the frequency reduction can be balanced, and an excellent sound pressure characteristic can be obtained over a wide band. A sounding component having a disk-shaped piezoelectric vibrating plate has resonance frequencies in odd order resonance modes, for example, a fundamental harmonic wave, a third order harmonic wave, and a fifth order harmonic wave, according to the diameter. However, if the resonance frequencies exist apart from each other, or if one of the odd order resonance modes is extremely excited, a large peak and trough occur in the sound pressure frequency characteristic and cause a deterioration in sound quality.

Patent Document 2 discloses a piezoelectric sounding body having a structure in which a rectangular piezoelectric vibrating plate is attached to a resin film larger than the piezoelectric vibrating plate. In the case of a rectangular vibrating plate, the vibrating plate has resonance frequencies in odd order resonance modes, for example, a fundamental harmonic wave, a third order harmonic wave, and a fifth order harmonic wave, according to the lengths of the short side and the long side, independently. That is to say, resonance modes exist in both directions of the short side and the long side. Therefore, a flat sound pressure characteristic can be obtained over a wide band by optimizing the resonance frequency in each resonance mode so as to minimize the peak-to-trough difference in the sound pressure, for example, by appropriately determining the size of the piezoelectric vibrating plate.

In any one of Patent Documents 1 and 2, the piezoelectric vibrating plate is attached to the resin film with an adhesive. Thermosetting adhesives, for example, epoxy resin-based adhesives and silicone resin-based adhesives are used as an adhesive. However, in the case where a thermosetting adhesive is used, the viscosity of the adhesive decreases temporarily during thermosetting. Therefore, the adhesive can creep upon to the piezoelectric vibrating plate. For example, if a soldering electrode is contaminated with the adhesive, a poor connection can occur. In addition, the adhesive can seep close to the edge of the film and become a hindrance when a case or the like is attached to the film. In addition, it is difficult to make the film thickness of the adhesive between the resin film and the piezoelectric vibrating plate uniform. Therefore, the sound pressure characteristic varies. In addition, in the case where a thermosetting adhesive is used for attaching, the manufacturing process includes, for example, applying an adhesive, attaching a piezoelectric vibrating plate to a resin film, setting the adhesive, applying an adhesive, attaching a case, and setting the adhesive. Therefore, a plurality of application processes and a plurality of setting processes are required. In addition, since the resin film is heated in each setting process, the resin film tends to deteriorate.

Patent Document 3 discloses a piezoelectric sounding body made by forming a pressure-sensitive tackiness layer on the entire surface of one surface of a resin film, attaching a piezoelectric vibrating plate to the center of the one surface of the resin film with the tackiness layer, and then pressing and fixing the periphery of the resin film with a case. When a tackiness layer is used as described above, unlike the case where an adhesive is used, creeping up and seeping out, and the variation in film thickness can be prevented, and the attaching process can be simplified. However, although not disclosed in Patent Document 3, in the case where a rectangular piezoelectric vibrating plate is attached to a resin film only with a tackiness layer, a separation can occur at the interface between the middle of each long side of the piezoelectric vibrating plate and the tackiness layer of the resin film during sounding. The reason is that, in the case of a rectangular piezoelectric vibrating plate, displacement in the middle in the longitudinal direction thereof is largest, and the tackiness layer does not have an adhesive force sufficient to follow the displacement of the piezoelectric vibrating plate. Once a separation occurs, the driving force of the piezoelectric vibrating plate is not sufficiently transmitted to the resin film, and therefore a drop in sound pressure occurs.

Patent Document 1: Japanese Unexamined Patent Application Publication No. 2002-112391

Patent Document 2: Japanese Unexamined Patent Application Publication No. 2003-219499

Patent Document 3: Japanese Unexamined Utility Model Application Publication No. 63-68298

SUMMARY OF THE INVENTION

Accordingly, an object of the preferred embodiment of the present invention is to provide a piezoelectric sounding body in which a high sound pressure can be obtained over a wide frequency band, the drawbacks in the case where a piezoelectric vibrating plate is attached to a resin film with an adhesive can be eliminated, and the separation between a piezoelectric vibrating plate and a tackiness layer can be prevented.

To attain the above-described object, the present invention provides a piezoelectric sounding body including a resin film, a piezoelectric vibrating plate smaller than the resin film, the piezoelectric vibrating plate being attached to the center of one surface of the resin film, and a case supporting the periphery of the resin film. The piezoelectric vibrating plate is formed in a rectangular shape. A tackiness layer is formed on the one surface of the resin film. The piezoelectric vibrating plate is attached to the center of the one surface of the resin film with the tackiness layer. An adhesive is applied between the middle of each long side of the piezoelectric vibrating plate and the resin film, along each long side of the piezoelectric vibrating plate.

A first characteristic of the present invention is that a rectangular piezoelectric vibrating plate is attached on a resin film. In the case where a rectangular piezoelectric vibrating plate is attached to a resin film, the vibrating plate has resonance frequencies in odd order resonance modes, for example, a fundamental harmonic wave, a third order harmonic wave, and a fifth order harmonic wave, according to the lengths of the short side and the long side, independently. Therefore, a flat sound pressure characteristic can be obtained over a wide band by optimizing the resonance frequency in each resonance mode so as to minimize the peak-to-trough difference in the sound pressure by appropriately determining the length of the short side and the long side of the piezoelectric vibrating plate.

A second characteristic is that the piezoelectric vibrating plate is attached to the resin film via a tackiness layer. In the case of a tackiness layer, unlike the case of an adhesive, a thermosetting process is not necessary, and attachment is completed just by pressing the piezoelectric vibrating plate against the resin film at room temperature. Therefore, the heating process is eliminated, and the resin film has no heat history. Using a resin film on which a tackiness layer has been formed in advance can provide a uniform film thickness of the tackiness layer between the resin film and the piezoelectric vibrating plate. In addition, the tackiness agent forming the tackiness layer does neither creep up onto the piezoelectric vibrating plate nor seep close to the edge of the film. Therefore, a piezoelectric sounding body having a less variable sound pressure characteristic can be obtained.

A third characteristic is that an adhesive is applied between the middle of each long side of the piezoelectric vibrating plate and the resin film, along each long side of the piezoelectric vibrating plate. In the case where a piezoelectric vibrating plate is attached to a resin film only with a tackiness layer, a separation tends to occur at the interface between the middle of each long side of the piezoelectric vibrating plate and the tackiness layer of the resin film during sounding. Particularly in the cases of sounding in a humid and hot condition and prolonged sounding, the separation tends to occur. By applying a reinforcing adhesive to the places at highest risk for occurrence of a separation, the separation can be surely prevented, and a drop in sound pressure can be prevented. In addition, by applying an adhesive, the variation in sound pressure can also be controlled. Since the adhesive is not applied at the interface between the piezoelectric vibrating plate and the resin film, there is no possibility of deteriorating the sound pressure characteristic.

The adhesive preferably has a low Young's modulus so as not to restrain the vibration of the piezoelectric vibrating plate and the resin film. For example, a urethane-based or silicone-based thermosetting adhesive can be used. The adhesive is preferably a thermosetting adhesive having a Young's modulus lower than that of the resin film. Since the adhesive needs to be applied along the edge of each long side of the piezoelectric vibrating plate, the adhesive is preferably applied using a dispenser or the like.

According to the preferred embodiment, it is preferable that the center of a range where the adhesive bonding the middle of each long side of the piezoelectric vibrating plate and the resin film is applied be at the midpoint of each long side of the piezoelectric vibrating plate, and the length of the range be ½ or more of the length of each long side. If the length of the application range is ½ or more of the length of each long side of the piezoelectric vibrating plate, the variation in characteristic can be controlled to 1 dB or less.

According to the preferred embodiment, the piezoelectric sounding body may have the following structure. That is to say, the case includes a front case and a rear case. The front case and the rear case are each an integral metal component having a central portion having sound emitting holes. The front case and the rear case are drawn so that their central portion are away from the tackiness layer of the resin film in the thickness direction. Peripheral flanges of the front case and the rear case are attached to both surfaces of the resin film. In this case, the flange of the front case can be attached using the tackiness layer formed on the one surface of the resin film. Therefore, the attaching process can be simplified, and the number of components constituting the case can be reduced. Therefore, a thin and low-cost piezoelectric sounding body can be achieved. Incidentally, the rear case can be attached to the lower surface of the resin film using an adhesive or a pressure-sensitive agent.

According to the preferred embodiment, a terminal plate may be attached to a part of the periphery of the one surface of the resin film with the tackiness layer. An electrode on the surface of the piezoelectric vibrating plate and an electrode on the surface of the terminal plate may be electrically connected via a lead. A front case having sound emitting holes and covering the piezoelectric vibrating plate without being in contact therewith may be attached with the tackiness layer to the periphery of the one surface of the resin film except for the region to which the terminal plate is attached. A rear case having sound emitting holes and covering the central portion of the resin film without being in contact therewith may be attached to the periphery of the other surface of the resin film. A lead for external connection may be directly connected to the piezoelectric vibrating plate. However, in this case, the load exerted on the lead acts directly on the piezoelectric vibrating plate and hinders the vibration of the piezoelectric vibrating plate. In addition, if a large tensile force acts on the lead, the piezoelectric vibrating plate can be damaged. When a terminal plate is attached to the resin film and the terminal plate and the piezoelectric vibrating plate are connected via a lead, external connection is performed via the terminal plate. Therefore, an external load can be prevented from acting directly on the piezoelectric vibrating plate, and a signal can be easily input into the piezoelectric vibrating plate. Although the terminal plate can be attached to any place on the periphery of the resin film, the terminal plate is preferably attached to a place along one short side of the piezoelectric vibrating plate. The reason is that the amount of displacement of the film during sounding is relatively small.

According to the preferred embodiment, it is preferable that the lead be a metal wire, both ends of the lead be connected to the electrode on the surface of the piezoelectric vibrating plate and the electrode on the surface of the terminal plate, and a slack be formed in the middle of the lead. In this case, since the lead has a slack in the middle thereof, the relative displacement between the piezoelectric vibrating plate and the terminal plate can be permitted. Therefore, the piezoelectric vibrating plate can vibrate smoothly, and an excellent sound pressure characteristic can be obtained.

As described above, according to the present invention, a rectangular piezoelectric vibrating plate is attached to a resin film, and the periphery of the film is supported by a case. Therefore, the vibrating plate can have resonance frequencies in odd order resonance modes, for example, a fundamental harmonic wave, a third order harmonic wave, and a fifth order harmonic wave, according to the lengths of the short side and the long side, independently. By an optimum resonance mode arrangement, a flat sound pressure characteristic can be obtained over a wide band. In addition, since the piezoelectric vibrating plate is attached on a tackiness layer formed on the resin film, a uniform film thickness of the tackiness layer between the resin film and the piezoelectric vibrating plate can be provided. In addition, the tackiness agent does neither creep up onto the piezoelectric vibrating plate nor seep close to the edge of the film. In addition, since a thermosetting process is not necessary unlike the case where an adhesive is used, the resin film has no heat history, and therefore deterioration can be prevented. In addition, an adhesive is applied between the middle of each long side of the piezoelectric vibrating plate and the resin film, along each long side of the piezoelectric vibrating plate. Therefore, a separation does not occur at the interface between the middle of each long side of the piezoelectric vibrating plate and the tackiness layer of the resin film during sounding, and a stable sound pressure can be obtained for a prolonged period.

REFERENCE NUMERALS

Figure 1:
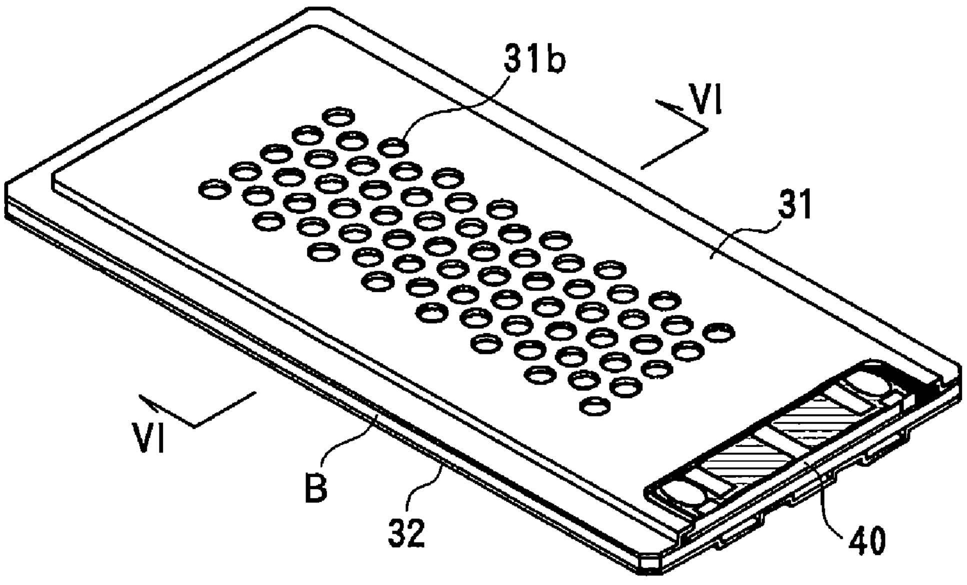
FIG. 1 is a perspective view of an example of a piezoelectric sounding body according to the present invention.
Figure 2:
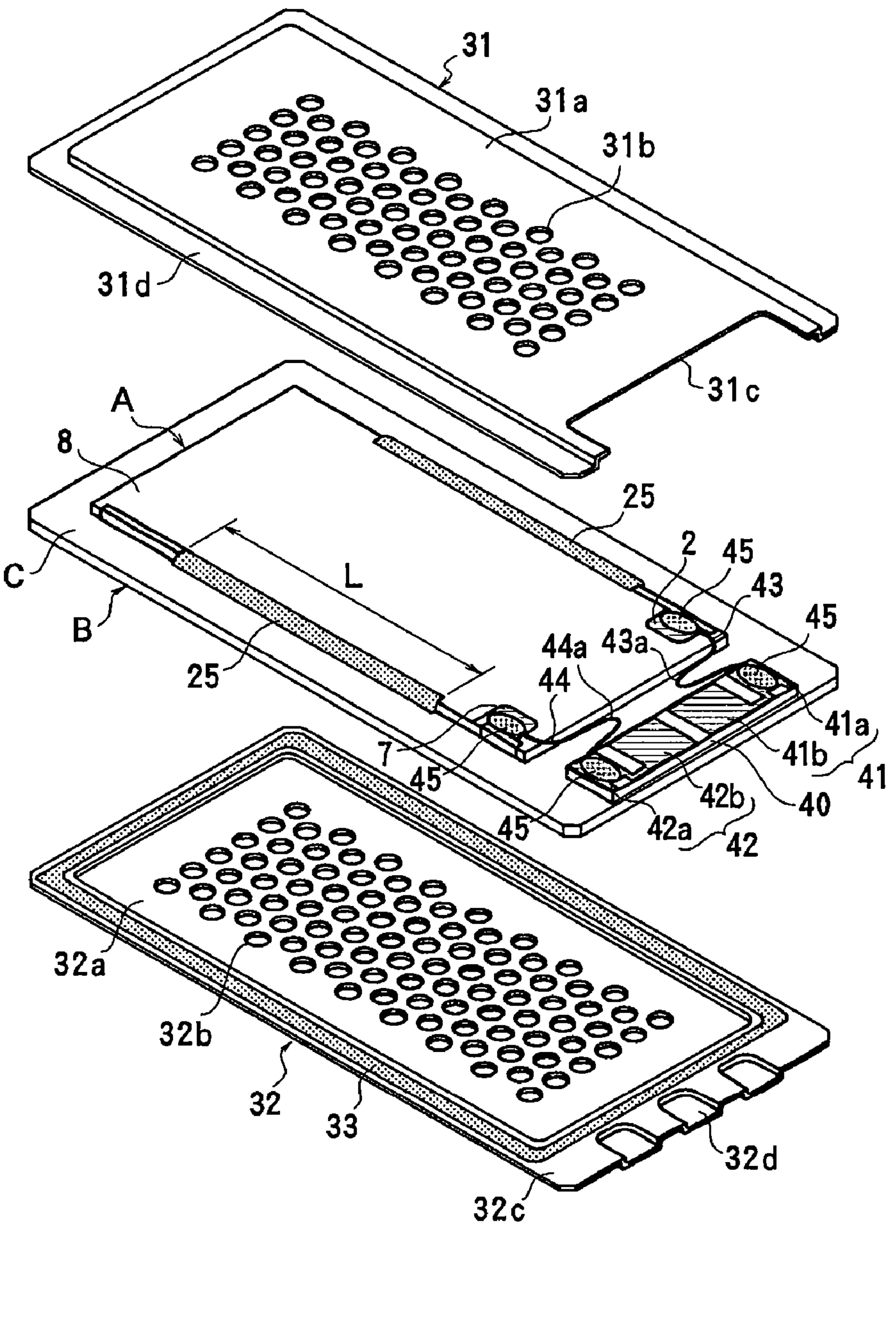
FIG. 2 is an exploded perspective view of the piezoelectric sounding body shown in FIG. 1.

A piezoelectric vibrating plate
B resin film
C tackiness layer
1, 10 piezoelectric element
2, 3, 12, 13 main surface electrode
4, 14 internal electrode
20 intermediate layer
25 adhesive
31 front case
31*a* drawn portion
31*b* sound emitting holes
31*d* flange
32 rear case
32*a* drawn portion
32*b* sound emitting holes
32*c* flange
40 terminal plate
43, 44 lead wire

DESCRIPTION OF THE INVENTION

The embodiment of the present invention will now be described with reference to examples.

EXAMPLE 1

FIGS. 1 to 6 show an example of a piezoelectric speaker, which is a first example of a piezoelectric sounding body according to the present invention. This example has a rectangular piezoelectric vibrating plate A and a rectangular resin film B to which the piezoelectric vibrating plate A is attached, and a case containing the resin film B. The case includes a front case 31 having many sound emitting holes 31*b*, and a rear case 32 having many sound emitting holes 32*b*.

Figure 4:
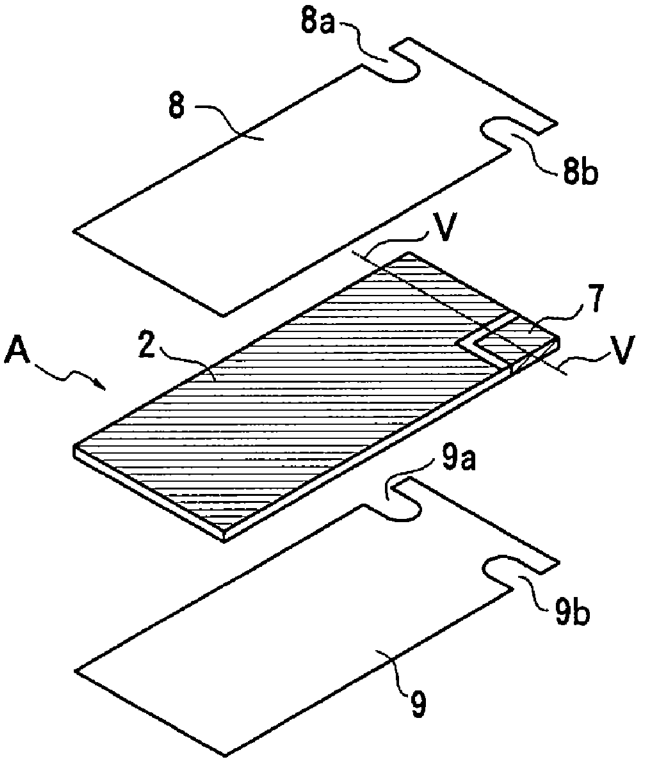
FIG. 4 is an exploded perspective view of a piezoelectric vibrating plate.
Figure 5:
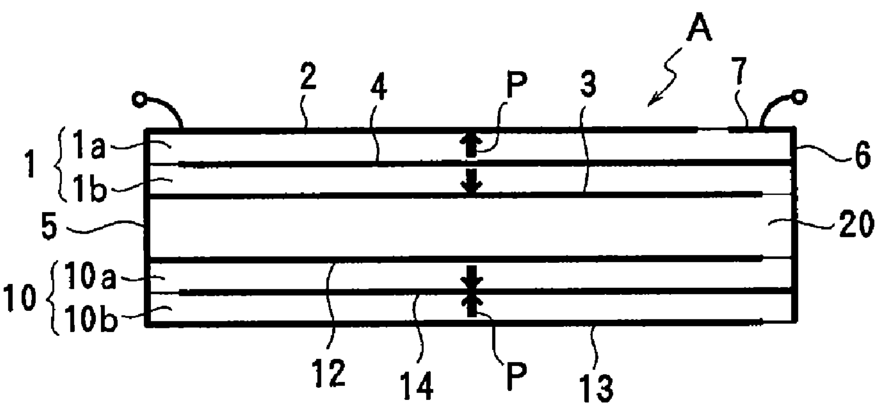
FIG. 5 is a schematic sectional view of the piezoelectric vibrating plate taken along line V-V of FIG. 4.
Figure 6:
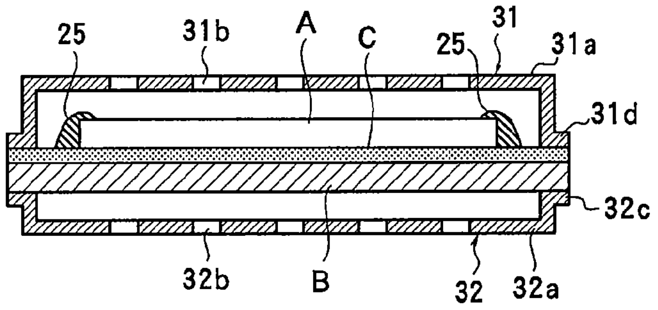
FIG. 6 is a schematic sectional view of the piezoelectric sounding body taken along line VI-VI of FIG. 1.

As shown in FIGS. 4 and 5, the piezoelectric vibrating plate A includes two laminated piezoelectric elements 1 and 10 with an intermediate layer 20 interposed therebetween, and has a general shape of a rectangular plate. The upper piezoelectric element 1 has two laminated piezoelectric ceramics layers 1*a* and 1*b*. Main surface electrodes 2 and 3 are formed on the upper and lower main surfaces of the piezoelectric element 1. An internal electrode 4 is formed between the ceramics layers 1*a* and 1*b*. The two ceramics layers 1*a* and 1*b* are polarized in opposite directions in the thickness direction as shown by arrows P. The lower piezoelectric element 10 is similar in structure to the upper piezoelectric element 1, but the polarization directions P are opposite. That is to say, two piezoelectric ceramics layers 10*a* and 10*b* are laminated. Main surface electrodes 12 and 13 are formed on the upper and lower main surfaces. An internal electrode 14 is formed between the ceramics layers 10*a* and 10*b*. The two piezoelectric ceramics layers 10*a* and 10 are polarized in opposite directions in the thickness direction as shown in arrows P. In this example, the ceramics layers 1*a*, 1*b*, 10*a* and 10*b* are each a rectangular PZT-based ceramics layer of 18×10 mm with a thickness of 15 μm. Although the intermediate layer 20 of this example is an unpolarized PZT-based ceramics layer, it may be polarized.

The upper main surface electrode 2 and the lower main surface electrode 3 of the piezoelectric element 1, and the upper main surface electrode 12 and the lower main surface electrode 13 of the piezoelectric element 10 are connected to each other via an end face electrode 5 formed on first end faces of the piezoelectric elements 1 and 10 and a first end face of the intermediate layer 20. The internal electrode 4 of the piezoelectric element 1 and the internal electrode 14 of the piezoelectric element 10 are connected to an end face electrode 6 formed on second end faces of the piezoelectric elements 1 and 10 and a second end face of the intermediate layer 20. A part of the main surface electrode 2 of the piezoelectric element 1 is cut off. In this space is formed an auxiliary electrode 7 connected to the end face electrode 6. When an alternate current signal is applied between the end face electrodes 5 and 6, the upper and lower piezoelectric elements 1 and 10 expand and contract in opposite directions in the plane direction with the intermediate layer 20 therebetween, thereby generating bending vibration.

The upper and lower surfaces of the piezoelectric vibrating plate A are covered by coating layers 8 and 9 as shown in FIG. 4. The coating layers 8 and 9 function as protective layers for preventing excessive displacement of the piezoelectric elements 1 and 10 due to drop impact and as masks for exposing only necessary portions of the electrodes. The coating layers 8 and 9 can be formed of, for example, an epoxy-based, polyimide-based, or polyamide-imide-based resin. Each of the coating layers 8 and 9 is preferably a thin film having a thickness of about 5 to about 20 μm so as not to block the vibration of the piezoelectric vibrating plate A. At both corners of one short side of the upper coating layer 8 are formed a cutout 8*a* through which a part of the main surface electrode 2 is exposed and a cutout 8*b* through which the auxiliary electrode 7 is exposed. In addition, in the lower coating layer 9 are formed similar cutouts 9*a* and 9*b*. However, these cutouts are provided for eliminating directionality and can be omitted.

The piezoelectric vibrating plate A is attached to substantially the center of the surface of a rectangular resin film B larger than the piezoelectric vibrating plate A. A tackiness layer C having a uniform thickness is formed on the entire upper surface of the resin film B in advance (see FIG. 6). The film B is preferably formed of a material that has a Young's modulus of 1 MPa to 10 GPa and a large loss coefficient (tan δ), for example, an ethylene-propylene rubber-based or styrene-butadiene rubber-based material. This planarizes the frequency characteristic. In the case where the tackiness layer C is formed of a material having a large loss coefficient, the resin film B can be formed of even a material having a small loss coefficient, for example, a polyimide-based material. The thickness of the resin film B is preferably 10 to 100 μm. In this example, the resin film B is formed of ethylene-propylene rubber, and the overall size thereof is 24×13 mm with a thickness of 70 μm. The tackiness layer C does not have to cover the entire surface of the resin film B but can cover only a necessary part thereof. The tackiness layer C can be formed of a pressure-sensitive tackiness agent, for example, a rubber-based, acrylic-based, or silicone-based pressure-sensitive tackiness agent.

An adhesive 25 is applied between the middle of each long side of the piezoelectric vibrating plate A and the resin film B, linearly along each long side of the piezoelectric vibrating plate. This adhesive 25 is a reinforcer for preventing a separation at the interface between the middle of each long side of the piezoelectric vibrating plate A and the tackiness layer C of the resin film B during sounding. The adhesive 25 is preferably a thermosetting adhesive having a low Young's modulus, for example, a urethane-based or silicone-based thermosetting adhesive so as not to restrain the displacement of the piezoelectric vibrating plate A. The adhesive 25 is preferably an adhesive having a Young's modulus lower than that of the resin film B.

It is preferable that the center of a range L where the adhesive 25 is applied be at the midpoint of each long side of the piezoelectric vibrating plate, and the length of the range L be ½ or more of the length of each long side. If the length of the application range is ½ or more of the length of each long side of the piezoelectric vibrating plate, the variation in characteristic can be controlled to 1 dB or less.

A terminal plate 40 is attached on the tackiness layer C on the periphery of the upper surface of the resin film B. In this example, the terminal plate 40 is attached to the periphery along one short side of the resin film B and is exposed from the front case 30. The terminal plate 40 includes an insulating substrate, for example, a glass epoxy substrate, and two terminal electrodes 41 and 42 provided on the insulating substrate. These terminal electrodes 41 and 42 are provided with lands 41*a* and 42*a* for conductive connection with the piezoelectric vibrating plate A and lands 41*b* and 42*b* for external conductive connection. The lands 41*a* and 42*a* are electrically connected to terminals 2 and 7 exposed from the coating layer 8 of the piezoelectric vibrating plate A via lead wires 43 and

44. Both ends of the lead wire 43 are soldered to the electrode 2 and the land 41*a* by solder pieces 45, 45. Both ends of the lead wire 44 are soldered to the electrode 7 and the land 42*a* by solder pieces 45, 45. In this example, the lead wires 43 and 44 have slacks 43*a* and 44*a* in their middles in order to reduce the stress generated between the piezoelectric vibrating plate A and the terminal plate 40 due to drop impact or the like and to reduce the binding force on the piezoelectric vibrating plate A.

The front case 31 is attached to a region on the tackiness layer C on the periphery of the resin film B except for the place to which the terminal plate 40 is attached. The front case 31 has a drawn portion 31*a* in the center thereof. The drawn portion 31*a* is drawn away from the surface of the resin film B. Due to the drawn portion 31*a*, a space for the piezoelectric vibrating plate A to vibrate is secured. A plurality of sound emitting holes 31*b* are formed in the drawn portion 31*a*. A cutout 31*c* is formed on the periphery of the front case 31 corresponding to the terminal plate 40. A flange 31*d* is formed on the periphery except for the cutout 31*c*. The flange 31*d* is attached to the tackiness layer C of the resin film B. The terminal plate 40 is exposed from the cutout 31*c*. In this example, the front case 31 is formed of a metal plate 0.15 mm thick. The depth of the drawn portion 31*a* is 0.40 mm. The diameter of the sound emitting holes 31*b* is 1 mm. The number of the sound emitting holes 31*b* is 50. The sound emitting holes 31*b* do not have to be round but can be elongated or square. If the diameter of the holes is large, at the time of drop impact, the edges of the holes exert a force on the piezoelectric vibrating plate A and can crack it. Therefore, the diameter is preferably 2 mm or less.

The lower side of the resin film B is supported by the rear case 32. Like the front case 31, the rear case 32 has a drawn portion 32*a* in the center thereof. The drawn portion 32*a* has many sound emitting holes 32*b* formed therein. A flange 32*c* is formed on the periphery of the drawn portion 32*a*. The rear case 32 is attached to the lower surface of the resin film B with an adhesive 33 applied circularly to the flange 32*c* (see FIG. 2). The flange 32*c* has a plurality of depressions 32*d* formed in a part thereof corresponding to the one short side of the resin film B to which the terminal plate 40 is attached. Although the rear case 32 is attached to the resin film B with the adhesive 33 in the above description, a tackiness agent similar to the tackiness layer C may be used instead of the adhesive 33. Since the drawn portion 31*a* of the front case 31 faces the piezoelectric vibrating plate A, the drawn portion 31*a* has to have a depth sufficient to prevent contact with the piezoelectric vibrating plate A. As for the drawn portion 32*a* of the rear case 32, since it only has to have a depth sufficient to permit the displacement of the resin film B, it may have a depth smaller than that of the drawn portion 31*a* of the front case 31. In this example, the rear case 32 is formed of a metal plate 0.15 mm thick. The depth of the drawn portion 32*a* is 0.25 mm.

Figure 3:
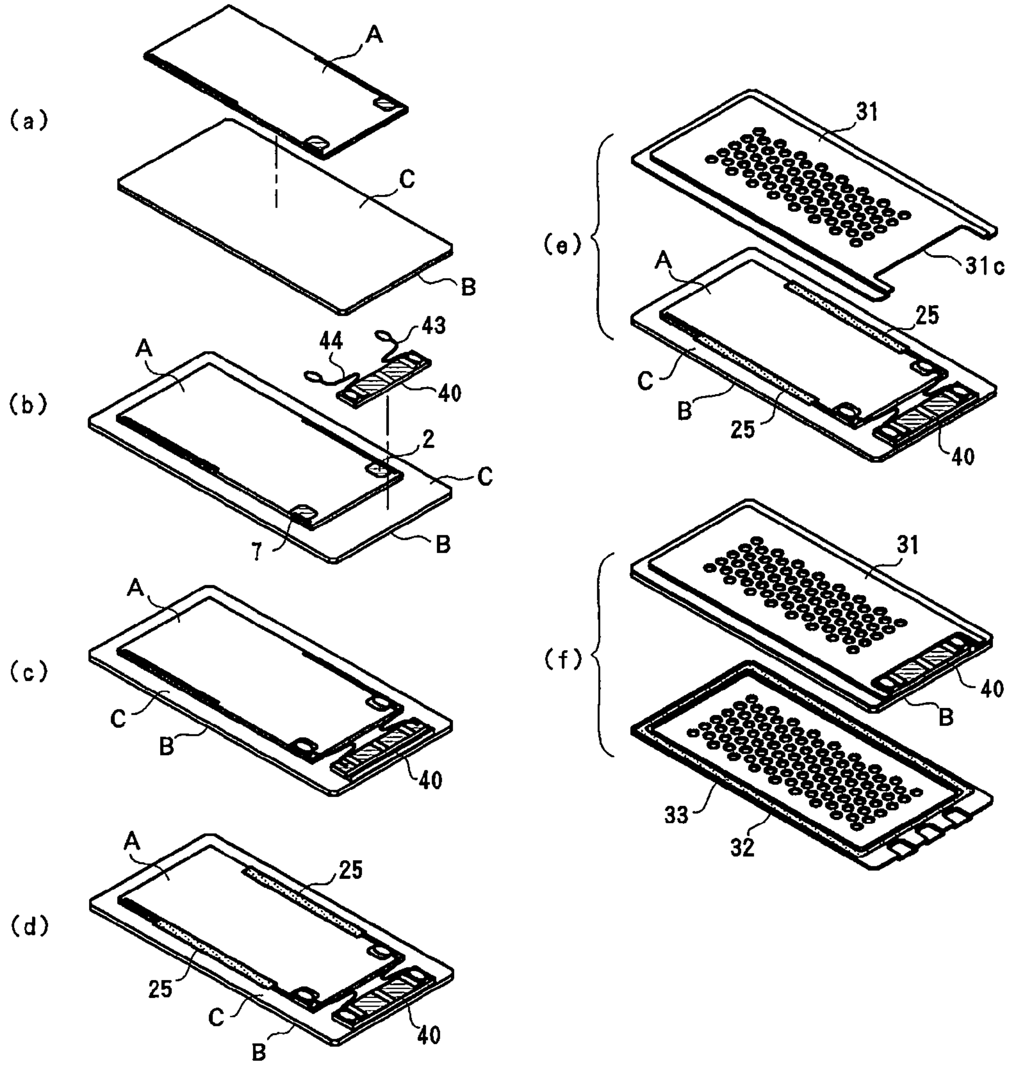
FIG. 3 is a perspective view showing an assembly process of the piezoelectric sounding body shown in FIG. 1.

FIG. 3 shows a method for assembling a piezoelectric sounding body having the above-described structure. First, as shown in FIG. 3(*a*), a resin film B and a piezoelectric vibrating plate A are prepared. The resin film B has a tackiness layer C formed on the entire upper surface thereof. Next, as shown in FIG. 3(*b*), the piezoelectric vibrating plate A is attached to the center of the resin film B. Next, as shown in FIG. 3(*c*), a terminal plate 40 is attached to a position on the periphery of the resin film B and along one short side of the piezoelectric vibrating plate A. Both ends of a lead wire 43 are soldered to the piezoelectric vibrating plate A and the terminal plate 40. Both ends of another lead wire 44 are also soldered to the piezoelectric vibrating plate A and the terminal plate 40.

Next, as shown in FIG. 3(*d*), an adhesive 25 for reinforcement is applied to the middle of each long side of the piezoelectric vibrating plate A and is then set. In order to reduce the effect of heat on the resin film B, the adhesive 25 is preferably one that can be set at a relatively low temperature (for example, 120° C.). Next, as shown in FIG. 3(*e*), a front case 31 is pressed against the upper surface of the resin film B to which the piezoelectric vibrating plate A and the terminal plate 40 have been attached. The front case 31 is attached to the resin film B with the tackiness layer C. When the front case 31 is attached to the resin film B, the terminal plate 40 is exposed from the cutout 31*c* of the front case 31. Finally, as shown in FIG. 3(*f*), a rear case 32 is attached with an adhesive 33 to the lower surface of the resin film B to which the front case 31 has been attached. Thus, a piezoelectric sounding body is completed. The adhesive 33 is also preferably one that can be set at a relatively low temperature (for example, 120° C.).

The piezoelectric sounding body according to this example has a structure in which both surfaces of a resin film B to which a piezoelectric vibrating plate A is attached are supported by a pair of drawn cases 31 and 32. Therefore, the number of components of the piezoelectric sounding body is small, and the piezoelectric sounding body is generally thin (for example, 1 mm or less). In addition, since a signal is input into the piezoelectric vibrating plate A via the terminal plate 40 attached to the resin film B, there is no need to connect a lead wire for external connection directly to the piezoelectric vibrating plate A, and there are few factors hindering the vibration of the piezoelectric vibrating plate A.

Figure 7:
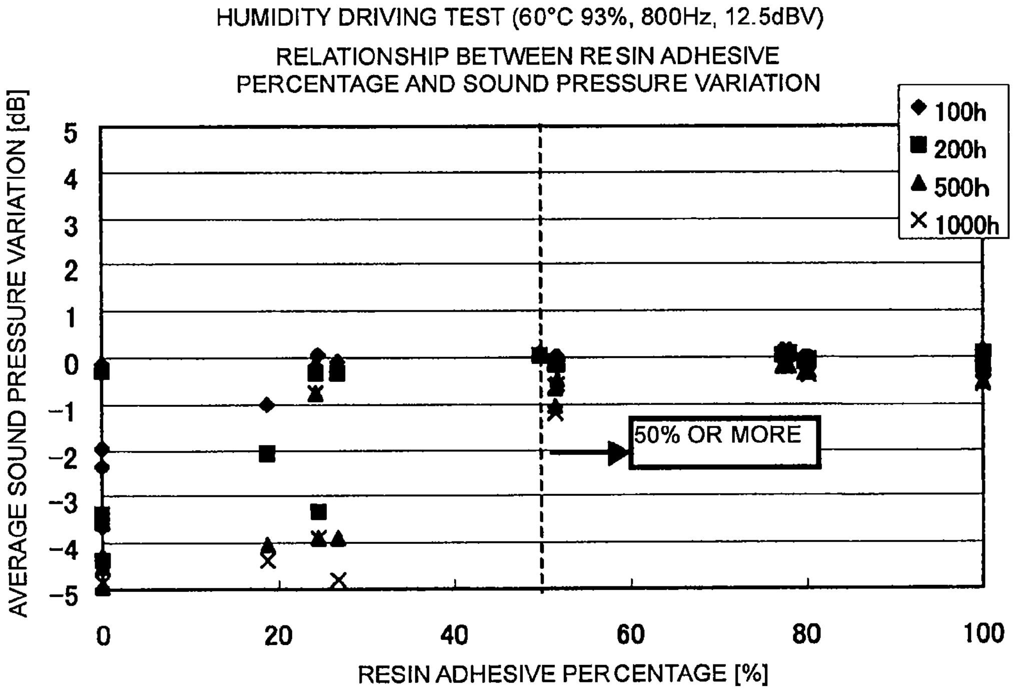
FIG. 7 shows the relationship between the application percentage of an adhesive and the sound pressure variation in the case where the adhesive is applied between each long side of the piezoelectric vibrating plate and the resin film, and the piezoelectric vibrating plate is driven for a long time.

FIG. 7 shows the relationship between the application percentage of the adhesive 25 to the longitudinal length of the piezoelectric vibrating plate A and the sound pressure variation when the adhesive 25 is applied to the edge of the middle of each long side of the piezoelectric vibrating plate A and is then set and a sine-wave signal of 12.5 dBV at the resonant frequency is applied to the piezoelectric vibrating plate A for a long time in an environment at 60° C. and 93% RH. The shown sound pressure is the average sound pressure of 800 to 2 kHz. As shown, applying the adhesive 25 as described above can prevent a separation at the interface between the piezoelectric vibrating plate A and the tackiness layer C on the resin film B and can prevent a drop in sound pressure. As shown, particularly when the application percentage of the adhesive 25 is 50% or more, a highly stable sound pressure can be obtained. Even when the piezoelectric sounding body is sounded for 1000 hours, the sound pressure variation is at most about −1 dB.

Figure 8:
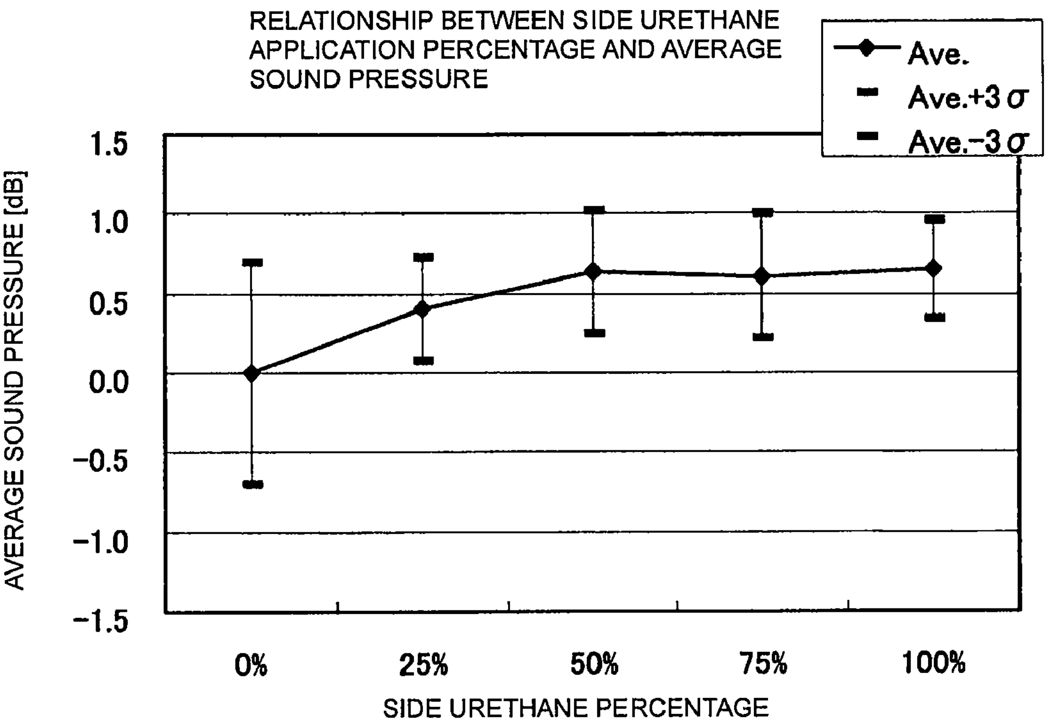
FIG. 8 shows the relationship between the application percentage of the adhesive and the sound pressure characteristic.

FIG. 8 shows the relationship between the application percentage of the adhesive 25 and the sound pressure characteristic. Compared to the case where the adhesive 25 is not applied (0%), applying the adhesive 25 increases the sound pressure by about 0.4 to about 0.7 dB. Particularly when the application percentage of the adhesive 25 is 50% or more, the increased sound pressure is substantially constant. Where as the variation in average sound pressure is about ±0.7 dB when the adhesive 25 is not applied, the variation in average sound pressure can be reduced to about ±0.3 dB by applying the adhesive 25.

EXAMPLE 2

Figure 9:
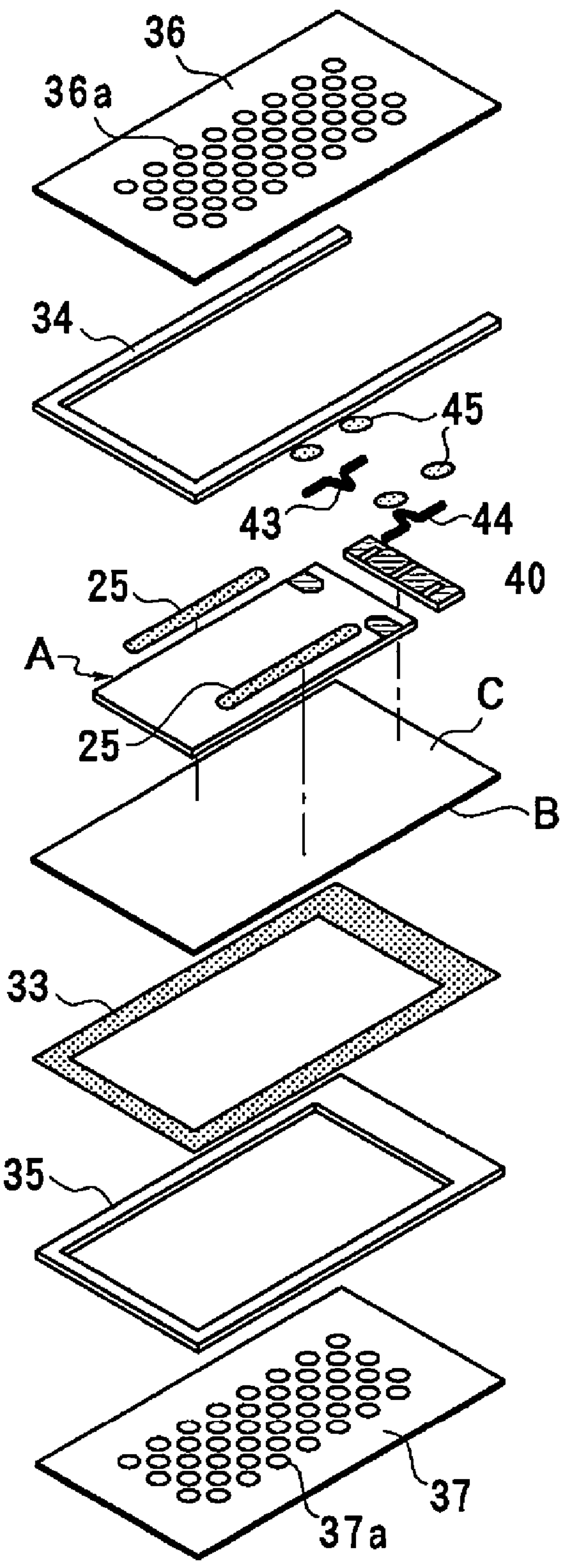
FIG. 9 shows a second example of a piezoelectric sounding body.

FIG. 9 shows a second example of a piezoelectric sounding body. The same reference numerals will be used to designate the same components as those in the first example, so that the description will be omitted. The piezoelectric sounding body of this example differs from the first example in the structure of the case supporting the periphery of the resin film B. The periphery of the resin film B to which the piezoelectric vibrating plate A has been attached is sandwiched and supported from above and below by frames 34 and 35, the frames 34 and 35 being attached to the resin film B. Next, flat covers 36 and 37 having sound emitting holes 36*a* and 37*a* are attached to the frames 34 and 35. Thus, a case is constructed. The upper frame 34 is formed in a square U-shape open toward the terminal plate 40. The lower frame 35 is formed in a hollow square. The adhesive 33 bonding the frame 35 and the resin film B is formed in the same shape as the frame 35. Also in this case, a tackiness layer C having a uniform thickness is formed on the entire upper surface of the resin film B, and the upper frame 34 is attached to this tackiness layer C. The frames 34 and 35 and the covers 36 and 37 can be formed of a resin material or a metal material.

In this example, the piezoelectric sounding body can be mass-produced by attaching a plurality of piezoelectric vibrating plates A and a plurality of terminal plates 40 on a large resin film B, attaching a set of the frames 34 and a set of the frames 35 on the upper and lower surfaces of the resin film B, attaching a set of the covers 36 and a set of the covers 37 on the upper and lower surfaces thereof, and then cutting into individual piezoelectric sounding bodies.

Figure 10:
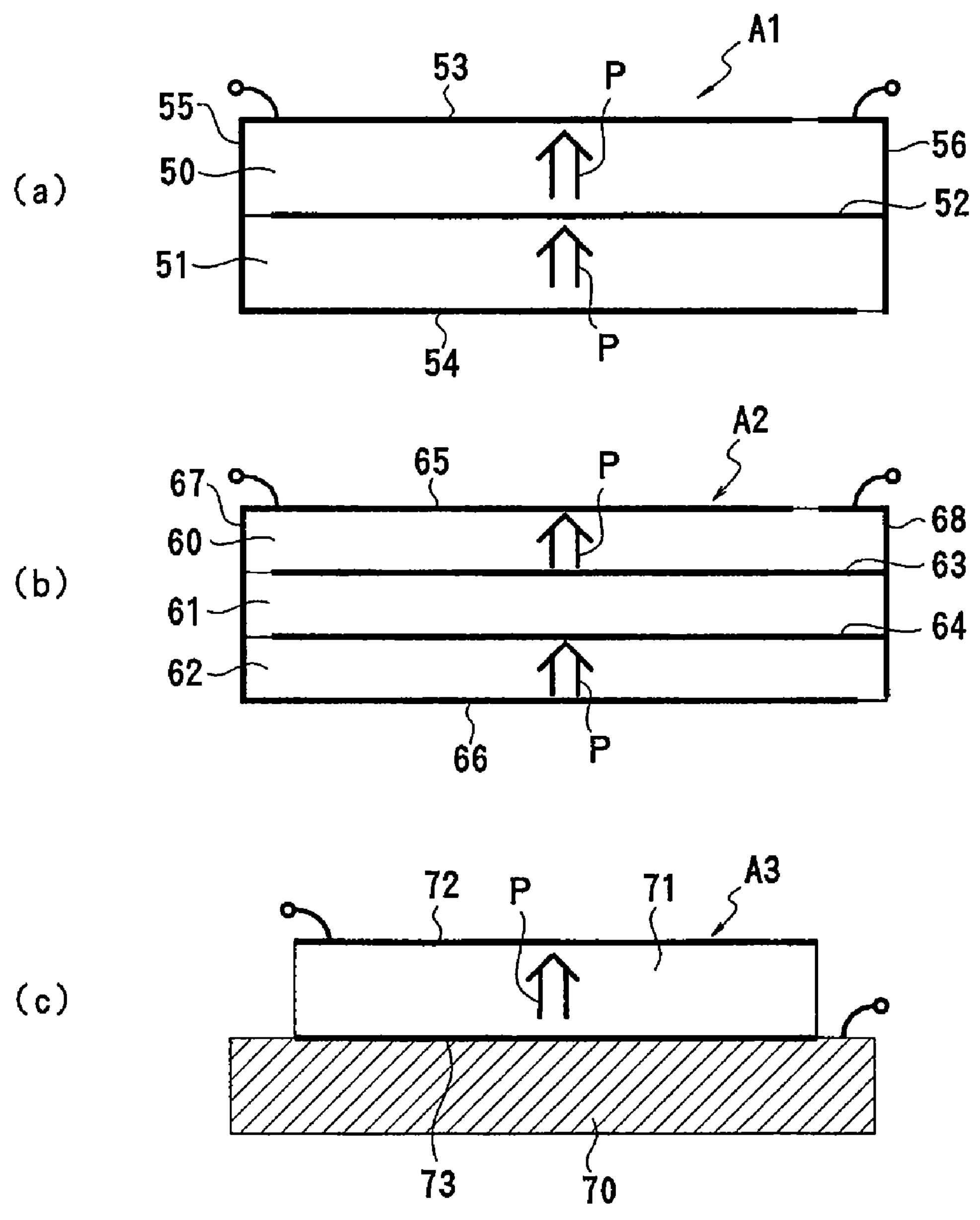
FIG. 10 is a schematic sectional view showing several other examples of a piezoelectric vibrating plate.

FIG. 10 shows several examples of a piezoelectric vibrating plate. The piezoelectric vibrating plate A1 of FIG. 10(*a*) includes two laminated piezoelectric ceramics layers 50 and 51 and an internal electrode 52 interposed therebetween. Main surface electrodes 53 and 54 are formed on the upper and lower main surfaces of the piezoelectric vibrating plate. The polarization axes P of the two piezoelectric ceramics layers 50 and 51 are in the same direction in the thickness direction. The main surface electrodes 53 and 54 are connected to each other by an end face electrode 55. The internal electrode 52 is connected to another end face electrode 56.

The piezoelectric vibrating plate A2 of FIG. 10(*b*) includes three laminated piezoelectric ceramics layers 60, 61, and 62 and two internal electrodes 63 and 64 interposed therebetween. Main surface electrodes 65 and 66 are formed on the upper and lower main surfaces of the piezoelectric vibrating plate. The polarization axes P of the upper and lower piezoelectric ceramics layers 60 and 62 are in the same direction in the thickness direction. The middle piezoelectric ceramics layer 61 is not polarized. The main surface electrodes 65 and 66 are connected to an end face electrode 67. The internal electrodes 63 and 64 are connected to another end face electrode 68. Since the two internal electrodes 63 and 64 are at the same potential, the middle piezoelectric ceramics layer 61 may be polarized in either direction.

While the first example and the examples of FIGS. 10(*a*) and 10(*b*) have a bimorph structure, the piezoelectric vibrating plate A3 of FIG. 10(*c*) has a unimorph structure in which a piezoelectric element 71 is attached to the upper surface of a metal plate 70. Electrodes 72 and 73 are formed on both main surfaces of the piezoelectric element 71. The electrode 73 is electrically connected to the metal plate 70. An alternate current signal is applied between the main surface electrode 72 and the metal plate 70.

The piezoelectric vibrating plates that can be used in the present invention are not limited to the above-described examples. Any piezoelectric vibrating plate can be used as long as it can be attached on a resin film B with a tackiness layer C and generates bending vibration when an alternate current signal is input.

The present invention is not limited to the above-described examples, and various changes may be made therein without departing from the spirit of the present invention. In the above-described examples, the terminal plate 40 is attached next to the piezoelectric vibrating plate A on the resin film B, and the piezoelectric vibrating plate A and the terminal plate 40 are connected by lead wires 43 and 44. However, instead of the lead wires, a conductive adhesive may be used for connecting the piezoelectric vibrating plate A and the terminal plate 40. Alternatively, it is possible to omit the terminal plate 40 and to connect a lead wire for external connection directly to the piezoelectric vibrating plate A. The resin film B does not have to be rectangular but can be square, circular, or elliptical. Therefore, the case does not have to be rectangular, either.

The invention claimed is:

1. A piezoelectric sounding body comprising:

a vibrating member comprising:

a resin film;

a tackiness layer formed on one surface of the resin film;

a rectangular piezoelectric vibrating plate smaller than the resin film, the piezoelectric vibrating plate being attached to the center of the one surface of the resin film by the tackiness layer;

an adhesive applied between the middle of each long side of the piezoelectric vibrating plate and the resin film, and along each long side of the piezoelectric vibrating plate; and a case supporting a periphery of the resin film.

2. The piezoelectric sounding body according to claim 1, wherein the center of a range where the adhesive is applied is at the midpoint of each long side of the piezoelectric vibrating plate, and the length of the range is ½ or more of a length of each long side thereof.

3. The piezoelectric sounding body according to claim 1, wherein the case includes a front case and a rear case.

4. The piezoelectric sounding body according to claim 3, wherein the front case and the rear case are each an integral metal component having a central portion containing sound emitting holes.

5. The piezoelectric sounding body according to claim 4, wherein the front case and the rear case are drawn so that their respective central portions are away from the resin film in the thickness direction thereof.

6. The piezoelectric sounding body according to claim 5, wherein the front case and the rear case each have peripheral flanges that are attached to opposed surfaces of the resin film.

7. The piezoelectric sounding body according to claim 1, further comprising:

a terminal plate attached to a part of the periphery of the one surface of the resin film by the tackiness layer;

a first electrode on a surface of the piezoelectric vibrating plate; and a second electrode on a surface of the terminal plate, the first electrode and the second electrode electrically connected via a lead.

8. The piezoelectric sounding body according to claim 7, wherein the case includes a front case and a rear case.

9. The piezoelectric sounding body according to claim 8, wherein the front case and the rear case are each an integral metal component having a central portion containing sound emitting holes.

10. The piezoelectric sounding body according to claim 9, wherein the front case and the rear case are drawn so that their respective central portions are away from the resin film in the thickness direction thereof.

11. The piezoelectric sounding body according to claim 10, wherein the front case and the rear case each have peripheral flanges that are attached to opposed surfaces of the resin film.

12. The piezoelectric sounding body according to claim 8, wherein the front case has sound emitting holes and covers the piezoelectric vibrating plate without being in contact therewith, and the rear case has sound emitting holes and covers a central portion of the resin film without being in contact therewith.

13. The piezoelectric sounding body according to claim 12, wherein the front case is attached to the periphery of the one surface of the resin film with a first frame by the tackiness layer, and the rear case is attached to the periphery of a surface of the resin film opposite to the one surface of the resin film.

14. The piezoelectric sounding body according to claim 12, wherein the front case covers the piezoelectric vibrating plate except for a region thereof to which the terminal plate is attached.

15. The piezoelectric sounding body according to claim 7, wherein the lead is a metal wire, a first end of the lead is connected to the first electrode on the surface of the piezoelectric vibrating plate, a second end of the lead is connected to the second electrode on the surface of the terminal plate, and a slack is formed in a middle of the lead.

* * * * *